United States Patent
Kim et al.

(10) Patent No.: US 7,262,474 B2
(45) Date of Patent: Aug. 28, 2007

(54) MAGNETIC MEMORY DEVICE AND METHOD OF MANUFACTURING THE SAME

(75) Inventors: Tae-wan Kim, Yongin-si (KR); Kook-rin Char, Seoul (KR); Dae-sik Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/045,476

(22) Filed: Jan. 31, 2005

(65) Prior Publication Data
US 2005/0185457 A1      Aug. 25, 2005

(30) Foreign Application Priority Data
Jan. 29, 2004   (KR) ............... 10-2004-0005641

(51) Int. Cl.
*H01L 29/82* (2006.01)
*H01L 43/00* (2006.01)

(52) U.S. Cl. ....................... 257/421; 257/422

(58) Field of Classification Search ......... 257/421–422
See application file for complete search history.

(56) References Cited

U.S. PATENT DOCUMENTS

2002/0141233 A1* 10/2002 Hosotani et al. ............ 365/158
2004/0042128 A1*  3/2004 Slaughter et al. ........ 360/324.2

FOREIGN PATENT DOCUMENTS

KR    10-2003-0063091       7/2003

* cited by examiner

*Primary Examiner*—Cuong Nguyen
(74) *Attorney, Agent, or Firm*—Lee & Morse, P.C.

(57) ABSTRACT

In a magnetic memory device, and a method of manufacturing the same, the magnetic memory device includes a switching device, and a magnetic tunneling junction (MTJ) cell connected to the switching device, the MTJ cell including a lower electrode connected to the switching device and a lower magnetic layer, a tunneling film containing fluorine, an upper magnetic layer, and a capping layer, sequentially stacked on the lower electrode.

8 Claims, 12 Drawing Sheets

MAGNETIC MEMORY DEVICE AND METHOD OF MANUFACTURING THE SAME

BACKGROUND OF THE INVENTION

1. Field of the Invention

The present invention relates to a memory device and a method of manufacturing the same. More particularly, the present invention relates to a magnetic memory device and a method of manufacturing the magnetic memory device.

2. Description of the Related Art

Magnetic memory devices, such as magnetic random access memory (MRAM), are very sensitive to a variation of resistance between cells because of weak sensing signals. Therefore, if there is a large resistance deviation between cells, it may be difficult to correctly read data recorded in the memory device.

Even if a sensing error is minimized by minimizing the resistance deviation between cells, when stability of the memory cells is not ensured, i.e., when a sufficient magnetic resistance (MR) ratio is not achieved, it may be difficult not only to correctly read data but also to correctly record data to the magnetic memory device.

Accordingly, research has been conducted into minimizing the resistance deviation between cells and ensuring stability of cells. However, a more reliable magnetic memory device has not yet been developed.

Resistance deviation between cells of the magnetic memory device and the MR ratio are directly related to characteristics of a tunneling film.

In a conventional memory device, an aluminum oxide, e.g., $Al_2O_3$, film is widely used as a tunneling film. When the tunneling film is an aluminum oxide film, it may be formed to be thinner than about 12 Å for matching a sense circuit, to have a resistance as low as about 10 $K\Omega\mu m^2$, and to have a uniform thickness so that a resistance variation between cells is less than 2%. When a thickness deviation of the aluminum oxide film is about 1 Å, the resistance varies about by about a factor of ten, i.e., one order of magnitude. Therefore, the aluminum oxide film should have thickness uniformity so that the maximum thickness variation in the cells is less than 1 Å.

FIGS. 1 and 2 illustrate cross-sectional views illustrating a process for forming an aluminum oxide film in the course of manufacturing a conventional MRAM in which an aluminum oxide film is used as a tunneling film.

Referring to FIG. 1, an aluminum (Al) film 12 is formed on a synthetic anti-ferromagnetic (SAF) film 10. Reference numeral 12a in FIG. 1 indicates a grain boundary. During the process, the Al film 12 is oxidized through a predetermined oxidation process. As illustrated in FIG. 2, as a result of the oxidation, an aluminum oxide film 14 is formed on the SAF film 10. The oxidation of the Al film 12 starts along the grain boundary 12a and progresses into the grain, as indicated by arrows in FIG. 1. More specifically, the oxidation of the Al film 12 starts at a region 12b adjacent to the grain boundary 12a and progresses into the grain.

In the case of a conventional MRAM, the resistance of the tunneling film formed as described above varies from region to region because the oxidation of the Al film 12 does not occur simultaneously everywhere on the Al film 12.

In addition, a thickness of the Al film 12 increases during oxidation. However, the thickness of the Al film 12 after oxidation is not uniform because the oxidation of the Al film 12 does not take place simultaneously over the entire region of the Al film 12, as noted above.

SUMMARY OF THE INVENTION

The present invention is therefore directed to a magnetic memory device and a method of manufacturing the magnetic memory device, which substantially overcome one or more of the problems due to the limitations and disadvantages of the related art.

It is a feature of an embodiment of the present invention to provide a magnetic memory device having a low resistance, a uniform thickness, a high magnetic resistance (MR) ratio, and a large process margin.

It is another feature of an embodiment of the present invention to provide a magnetic memory device having a reduced sensing error by minimizing a resistance deviation between cells of the magnetic memory device.

It is still another feature of an embodiment of the present invention to provide a method of manufacturing the magnetic memory device having a reduced oxidation process margin.

It is yet another feature of an embodiment of the present invention to provide a plasma reaction chamber used for manufacturing the magnetic memory device.

At least one of the above and other features and advantages of the present invention may be realized by providing a magnetic memory device includes a switching device, and a magnetic tunneling junction (MTJ) cell connected to the switching device, the MTJ cell including a lower electrode connected to the switching device and a lower magnetic layer, a tunneling film containing fluorine, an upper magnetic layer, and a capping layer, sequentially stacked on the lower electrode.

The lower magnetic layer may include a buffer film, an anti-ferromagnetic (AF) film, and a synthetic anti-ferromagnetic (SAF) film, sequentially stacked.

The fluorine of the tunneling film may be substantially uniformly distributed on a surface layer of the tunneling film.

The tunneling film may be an aluminium oxide film containing fluorine.

At least one of the above and other features and advantages of the present invention may be realized by providing a method of manufacturing a magnetic memory device including a switching device and a magnetic tunneling junction (MTJ) cell connected to the switching device, the method including forming a lower electrode, which is connected to the switching device, on an interlayer insulating layer covering the switching device, forming a lower magnetic layer on the lower electrode, forming a metal film on the lower magnetic layer, performing a oxy-fluoridation process on the metal film, forming an upper magnetic layer and a capping layer on the oxy-fluoridated metal film, and patterning the sequentially stacked layers on the lower electrode in reverse order.

Forming the metal film may include forming an aluminum film having a predetermined thickness.

Performing the oxy-fluoridation process on the metal film may include loading a resulting product on which the metal film is formed into a reaction chamber including an oxygen plasma generating apparatus and a fluorine source supplying apparatus and supplying oxygen plasma and fluorine source onto the metal film.

At least one of the above and other features and advantages of the present invention may be realized by providing a reaction chamber including a stage, a fluorine source supplying apparatus provided above the stage, and an oxygen plasma generating apparatus provided above the fluorine source supplying means.

In both the method and the reaction chamber, the fluorine source supplying apparatus may be a TEFLON® ring.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
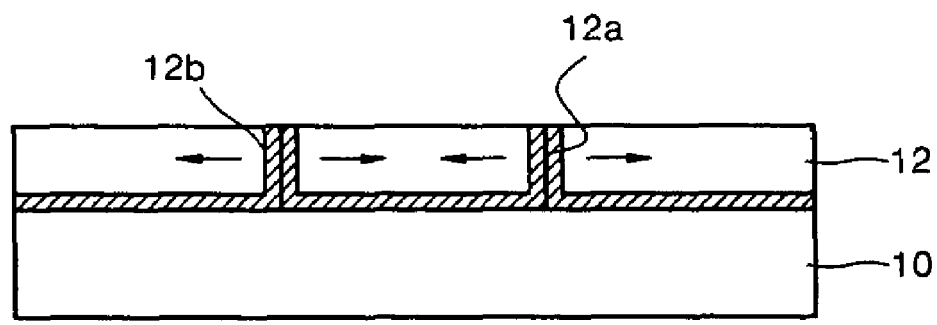
FIGS. 1 and 2 illustrate cross-sectional views of a process for forming an aluminum oxide tunneling film in the method of manufacturing a magnetic tunneling junction (MTJ) cell of a conventional memory device.
Figure 2:
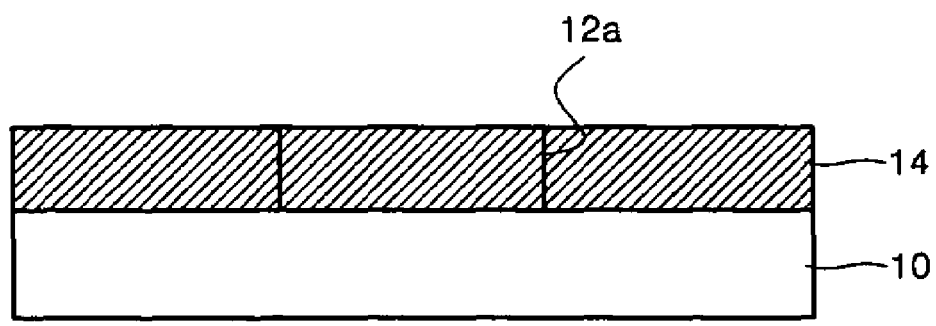

Korean Patent Application No. 10-2004-0005641, filed on Jan. 29, 2004, in the Korean Intellectual Property Office, and entitled: "Magnetic Memory Device and Method of Manufacturing the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 3:
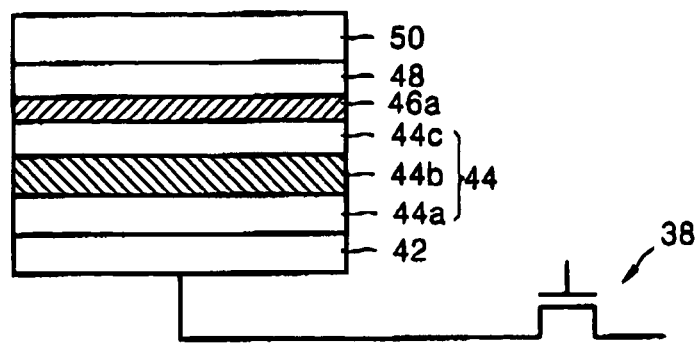
FIG. 3 illustrates a cross-sectional view of an MTJ cell of a memory device according to an embodiment of the present invention.

FIG. 3 illustrates a cross-sectional view of a magnetic tunneling junction (MTJ) cell of a memory device according to an embodiment of the present invention.

Referring to FIG. 3, an MTJ cell of a magnetic memory device includes a lower electrode 42, which connects a switching device 38, e.g., a transistor, to the MTJ cell, and a lower magnetic layer 44, a tunneling film 46a, an upper magnetic layer 48, and a capping film 50 sequentially formed on the lower electrode 42. An upper electrode (not shown) is formed on the capping film 50. The lower electrode 42 may be a tantalum (Ta) electrode or a titanium nitride (TiN) electrode. The lower magnetic layer 44 includes a buffer film 44a or a seed layer formed on the lower electrode 42, and a pinning film 44b and a pinned film 44c sequentially stacked on the buffer film 44a. The buffer film 44a may be one of an amorphous metal film, a ruthenium (Ru) film, and a nickel iron (NiFe) film. The pinning film 44b, which is an anti-ferromagnetic (AF) film, may be an iridium manganese (IrMn) film or a platinum manganese (PtMn) film. The pinned film 44c may be a multiple layer film or a single layer film. When the pinned film 44c is a multiple layer film (not shown), it may be an SAF film including a lower pinned film, a mediate film, and an upper pinned film. The lower pinned film may be an anti-ferromagnetic film, such as a CoFe film. The mediate film may be a metal film, e.g., a ruthenium (Ru) film. The upper pinned film may be an anti-ferromagnetic film, e.g., a CoFe film. The tunneling film 46a may be an insulating film including fluoride (F). For example, the tunneling film 46a may be an $AlO_xF_y$ film. When the tunneling film 46a is an aluminium oxide film containing fluoride, a thickness thereof is preferably less than about 12 Å and the fluoride may be substantially uniformly distributed on a surface layer thereof. This aspect of the present invention will be described in detail later with reference to test results related to a method of manufacturing a magnetic memory device according to an embodiment of the present invention.

The upper magnetic layer 48 is a free magnetic layer, which is a material layer having a predetermined magnetic moment. Polarization of the free magnetic layer may be either parallel or anti-parallel to polarization of the pinned film 44c according to voltage applied to the MTJ cell. The upper magnetic layer 48 may be a double layer considering an increment of an MR ratio. The capping film 50 is formed to protect the upper magnetic layer 48 during an etching process and may be a Ru film.

FIGS. 4 through 7 illustrate cross-sectional views of stages in a method of manufacturing the MTJ cell shown in FIG. 3.

A method of manufacturing a memory device, e.g., an MRAM, including the above-described MTJ cell will now be described with reference to FIGS. 4 through 7.

Figure 4:
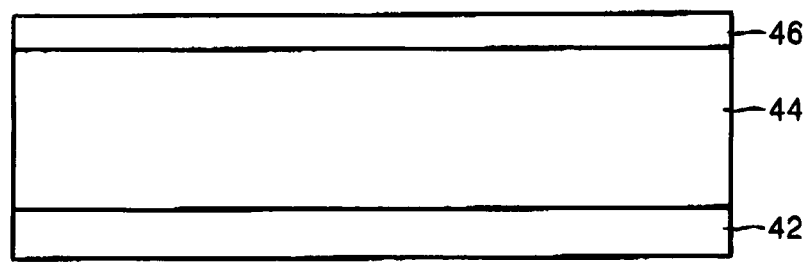
FIGS. 4 through 7 illustrate cross-sectional views of stages in a method of manufacturing the MTJ cell shown in FIG. 3.

After forming a switching device (not shown), e.g., a transistor, on a substrate (not shown), an interlayer insulating layer (not shown) having a contact hole that exposes a doped region, such as a source region or a drain region, of the transistor is formed on the substrate. A pad conductive layer filling the contact hole is formed on the interlayer insulating layer. As illustrated in FIG. 4, the lower electrode 42, the lower magnetic layer 44, and a metal film 46 for forming the tunneling film 46a are sequentially formed on the pad conductive layer. The lower electrode 42 and the lower magnetic layer 44 may be formed of material films for manufacturing the memory device, as described above. The metal film 46 for forming the tunneling film 46a may be an aluminium (Al) film. At this time, the metal film 46 may be formed to a thickness of less than about 12 Å, e.g., about 8 Å.

Figure 5:
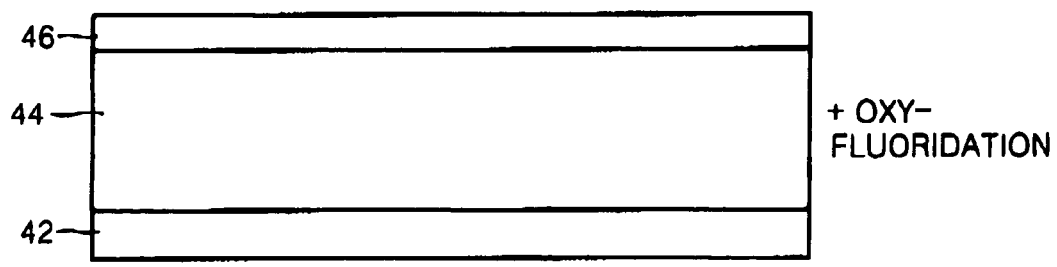
Figure 6:
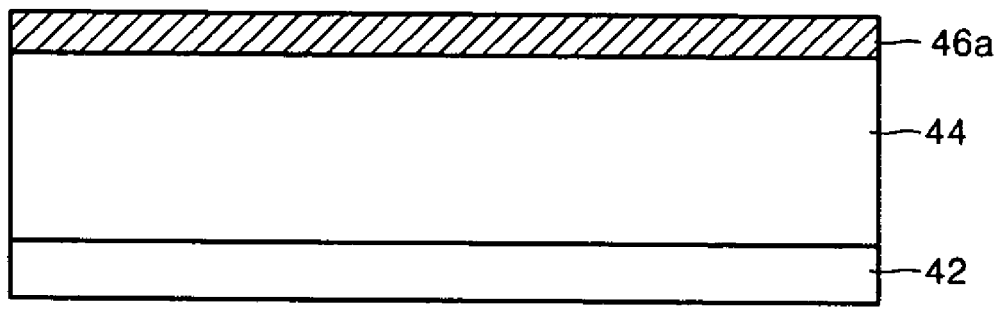

As illustrated in FIG. 5, a resulting product, in which the lower electrode 42, the lower magnetic layer 44, and the metal film 46 are sequentially formed, is transported to a plasma reaction chamber in which an oxidation and fluoridation process, i.e., an oxy-fluoridation process, is performed. While performing the oxy-fluoridation process, oxygen plasma together with a fluoride source is supplied onto the metal film 46. At this time, a thin film that contains a component of the metal film 46 and fluoride is formed on the metal film 46 as a result of reaction between the metal film 46 and fluoride. Due to the thin film on the metal film 46, the oxygen plasma can be evenly distributed over the entire surface of the metal film so that it can react with a metal component, e.g., aluminium, therein. Consequently, as illustrated in FIG. 6, a metal oxide film 46a, i.e., the tunneling film 46a, is formed on the lower magnetic layer 44.

The thickness of the tunneling film 46a including fluoride is uniform over the entire region since the metal film 46 is evenly distributed over the entire region. When the metal film is an aluminium film, the thickness of the tunneling film 46a increases up to about 12 Å during the oxy-fluoridation process.

Figure 7:
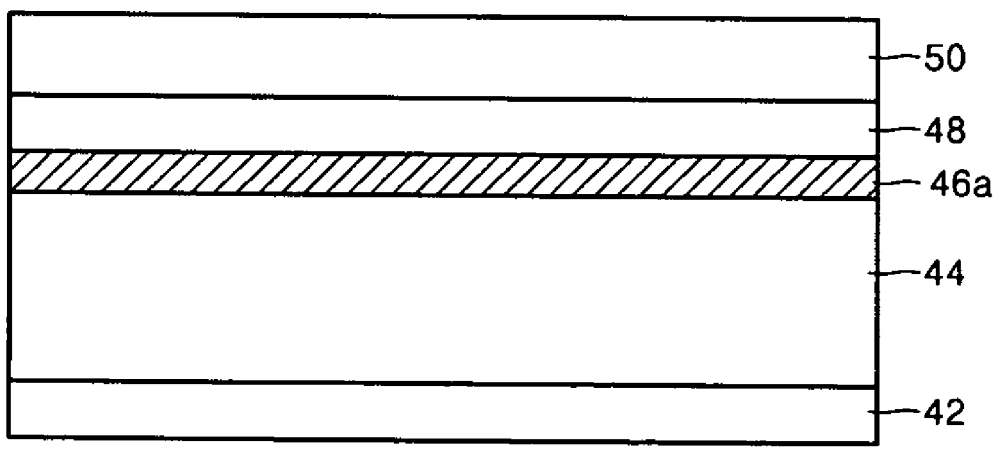

As illustrated in FIG. 7, the upper magnetic layer 48 and the capping film 50 are sequentially formed on the tunneling film 46a. The tunneling film 46a and the capping film 50 may be formed of materials described above for forming the memory device according to an embodiment of the present invention.

Figure 8:
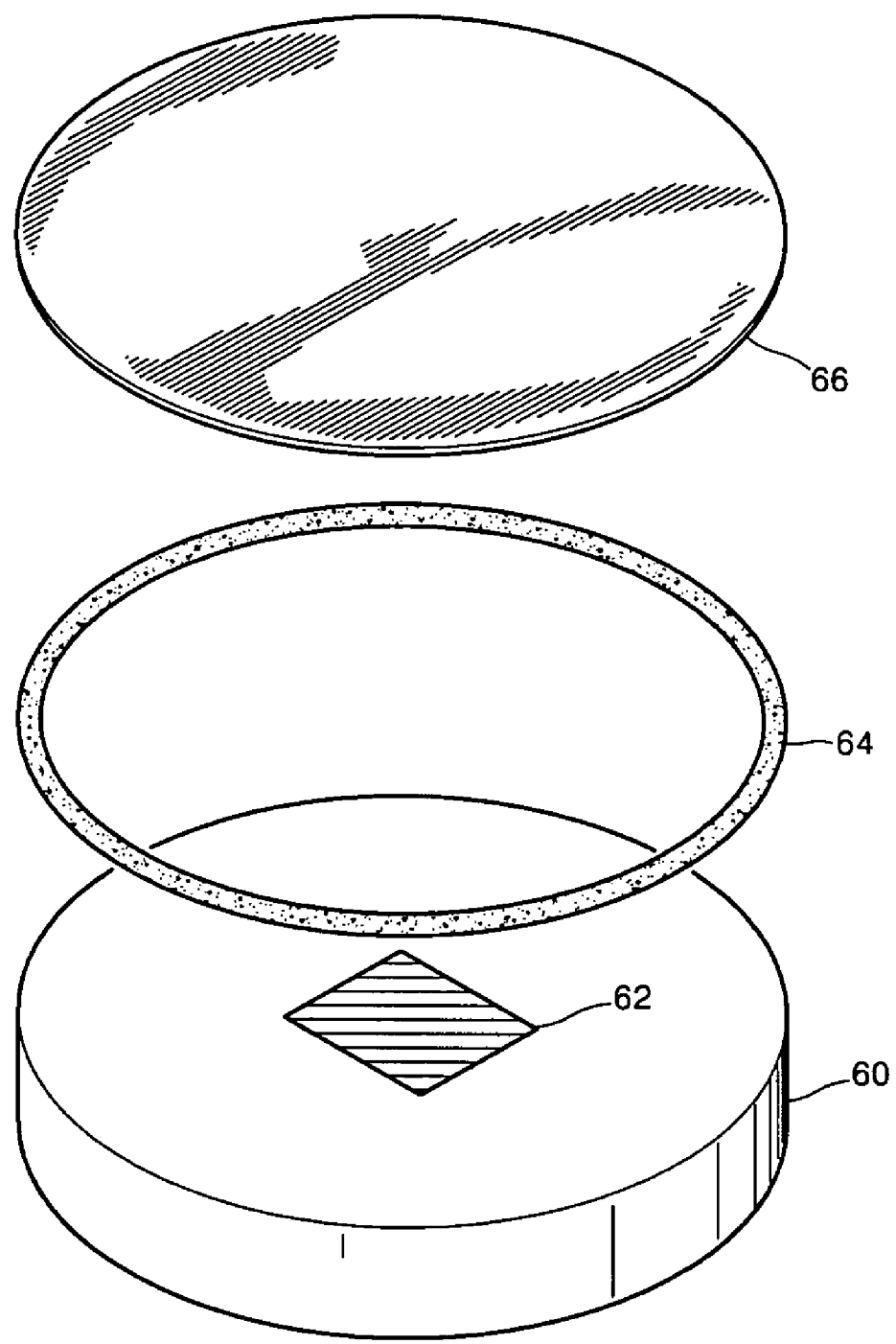
FIG. 8 illustrates a perspective view of a plasma chamber used for manufacturing the MTJ cell shown in FIG. 7.

FIG. 8 illustrates a perspective view of a plasma reaction chamber used for performing the oxy-fluoridation process.

Referring to FIG. 8, the reaction chamber includes a stage 60 on which a sample 62 to be processed is placed. The reaction chamber also includes a fluoride source supply apparatus 64, and a plasma generation apparatus 66 for generating plasma from a plasma source gas, e.g., oxygen ($O_2$) or a gaseous mixture of oxygen and argon (Ar). The fluoride source supply apparatus 64 may be a ring formed of TEFLON®, which is a trademark of DuPont.

Experimental results will now be described. For the experiments, a conventional tunneling film formed of an aluminium oxide ($AlO_x$) film (hereinafter, first magnetic memory device) and a tunneling film formed of an aluminium oxide film containing fluoride ($AlO_xF_y$) according to an embodiment of the present invention (hereinafter, second magnetic memory device) were prepared. With respect to the first and second magnetic memory devices, a tunneling magneto resistance (TMR) variation and a resistance variation according to oxidation time for forming the tunneling film were measured. In addition, voltage dependence of the TMR, uniformity of the tunneling film, effect of fluoride content, location of fluoride, and oxidation of the material film formed under the tunneling film were measured for the first and second magnetic memory devices.

FIGS. 9 through 18 are graphs showing the measurement results.

Figure 9:
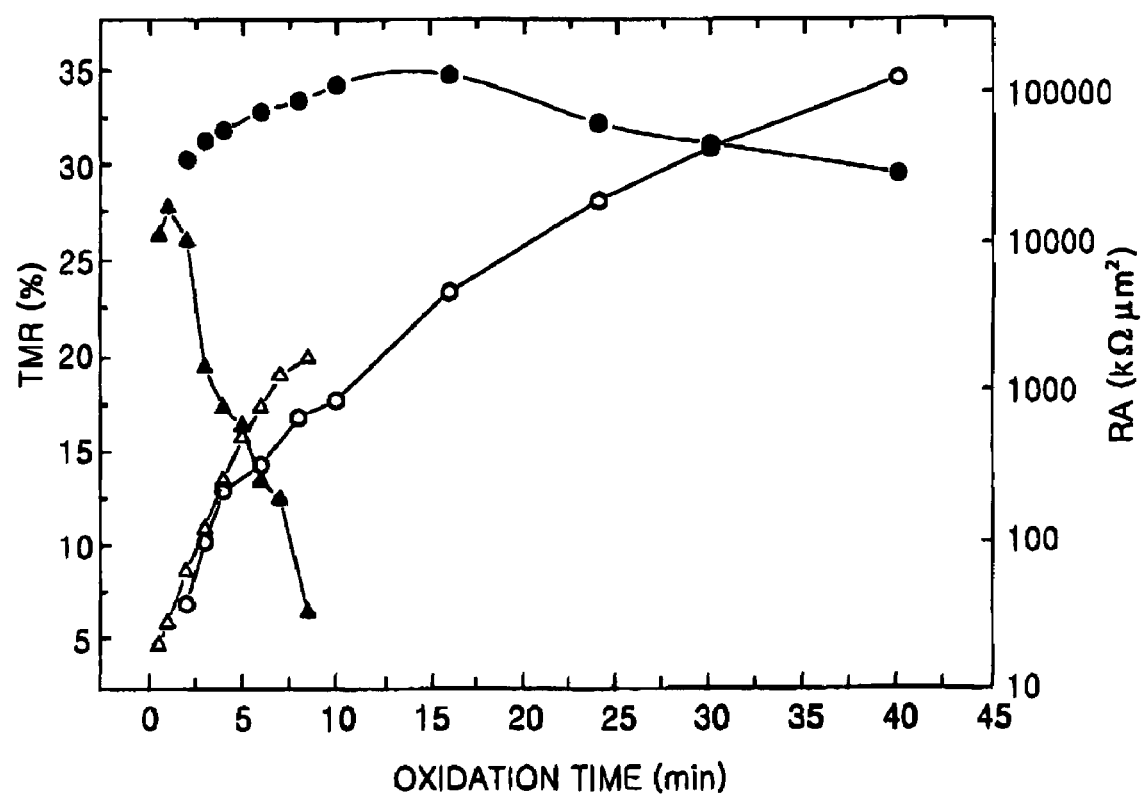
FIG. 9 is a graph of a tunneling magneto resistance (TMR) and resistance (RA) versus oxidation time of a conventional magnetic memory device and a magnetic memory device according to the embodiment of the present invention.

FIG. 9 shows TMR and resistance versus oxidation time for the first and second magnetic memory devices. Reference symbols ▲ and ● represent the TMR variation of the first and second magnetic memory devices, respectively. Reference symbols Δ and ○ represent the variation of resistance of the first and second magnetic memory devices, respectively.

Referring to FIG. 9, a TMR value of the first magnetic memory device decreases drastically down to about 5% over time, however, a TMR value of the second magnetic memory device is maintained relatively uniform at a high level of about 30-34%. This result indicates that an oxidation process margin of the second magnetic memory device is much greater than that of the first magnetic memory device.

Knowing that the variation of the TMR value of the first magnetic memory device is reduced drastically to about 5% after oxidizing for about ten minutes, the oxidation time for the first magnetic memory device should be less than ten minutes. The short oxidation time is advantageous with regard to productivity.

As depicted in FIG. 9, the resistance (RA) of the second magnetic memory device increases over time. However, when the oxidation time is less than ten minutes, the resistance value of the second magnetic memory device is lower than the first magnetic memory device.

Figure 10:
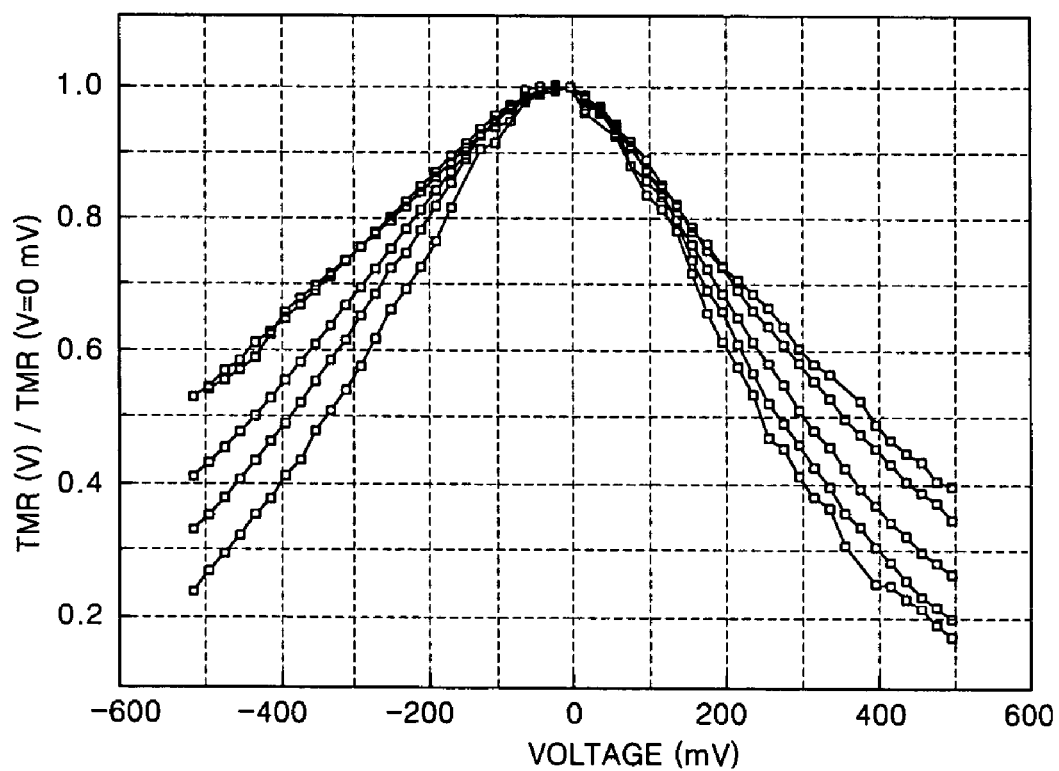
FIGS. 10 and 11 are graphs illustrating a voltage V dependence of a TMR of a conventional magnetic memory device and a magnetic memory device according to an embodiment of the present invention, respectively.
Figure 11:
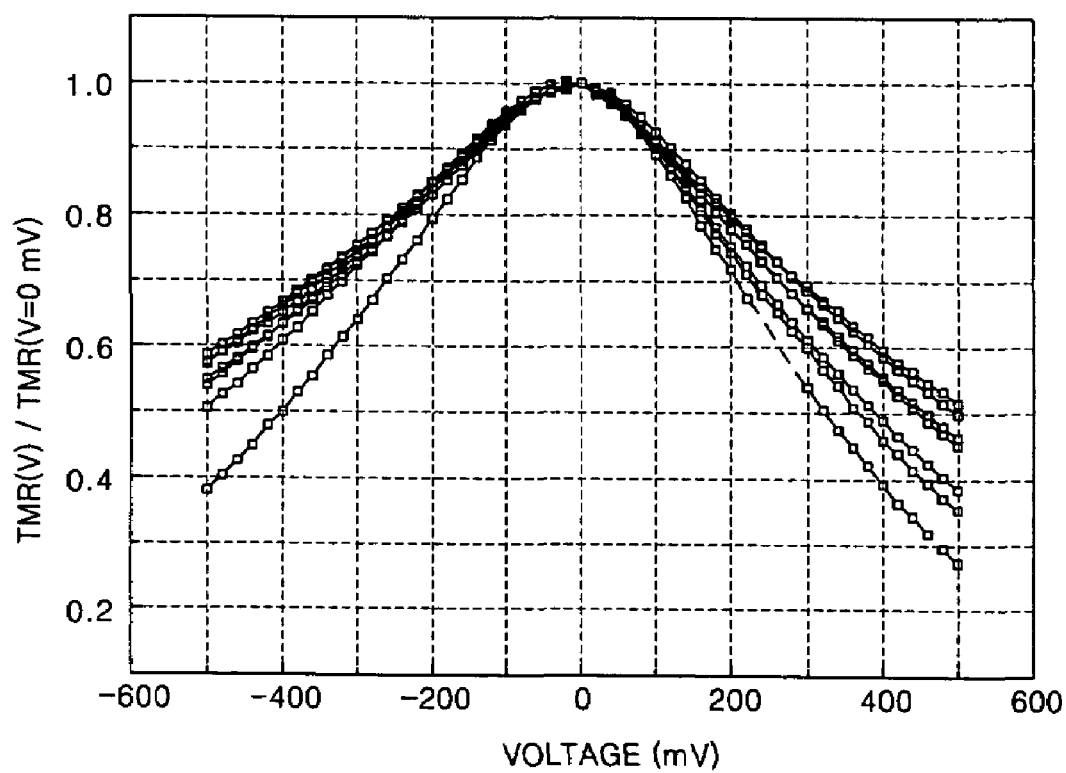

FIGS. 10 and 11 show the measured voltage dependence of TMR of the first and second magnetic memory devices, respectively.

The uppermost graph in FIG. 10 shows TMR (V) versus voltage of the first magnetic memory device including a tunneling film formed by oxidizing the metal film for one minute. The second graph from the top shows TMR (V) versus voltage of the first magnetic memory device including a tunneling film formed by oxidizing for two minutes. The third through fifth graphs from the top show TMR (V) versus voltage of the first magnetic memory device including a tunneling film formed by oxidizing for three minutes, four minutes, and six minutes, respectively.

The uppermost graph in FIG. 11 shows TMR (V) versus voltage of the second magnetic memory device including a tunneling film formed by oxy-fluoridating the metal film for two minutes. The second and third graphs from the top show TMR (V) versus voltage of the second magnetic memory device including a tunneling film formed by oxy-fluoridating the metal film for four minutes and ten minutes, respectively. The fourth through seventh graphs from the top show TMR (V) versus voltage of the second magnetic memory device including a tunneling film formed by oxy-fluoridating the metal film for sixteen, twenty-four, thirty, and forty minutes, respectively.

Comparing FIG. 10 with FIG. 11, in all cases, variation of the TMR (V) with voltage is greater in the first magnetic memory device than in the second magnetic memory device. This result shows that the voltage dependency of the first magnetic memory device is greater than that of the second magnetic memory device.

Figure 12:
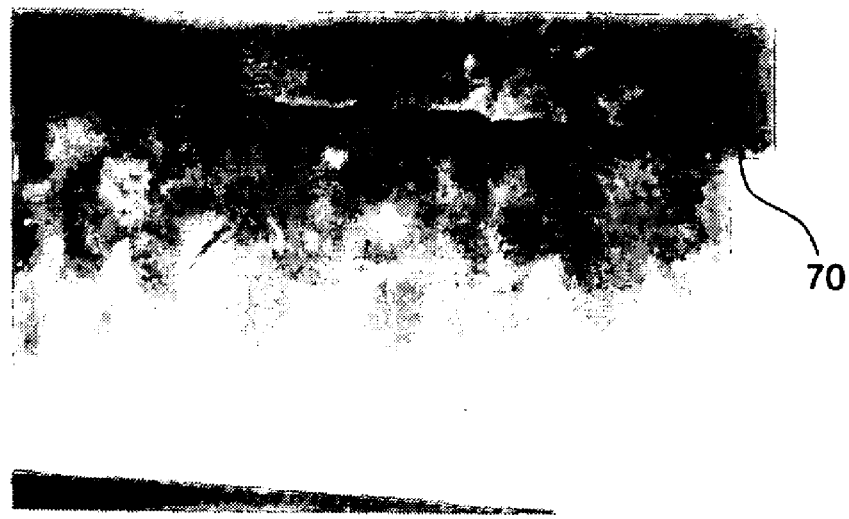
FIGS. 12 and 13 are transmission electron microscope (TEM) images of a cross-section of a tunneling film of a conventional magnetic memory device and a magnetic memory device according to an embodiment of the present invention, respectively.
Figure 13:

FIG. 12 is a transmission electron microscope (TEM) image of a portion of a region including an MTJ cell of a tunneling film 70 of the first magnetic memory device. FIG. 13 is a TEM image of a portion of a region including an MTJ cell of a tunneling film 80 of the second magnetic memory device.

Comparing the tunneling film 70 of the first magnetic memory device shown in FIG. 12 and the tunneling film 80 of the second magnetic memory device shown in FIG. 13, it is observed that the tunneling film 80 of the second magnetic memory device exhibits much better uniformity of thickness and planarity than the tunneling film 70 of the first magnetic memory device.

More specifically, the tunneling film 70 of the first magnetic memory device shown in FIG. 12 has an uneven thickness with large local variations. The tunneling film 80 of the second magnetic memory device shown in FIG. 13, however, has a uniform thickness and a smooth surface over its entire area thereof.

Figure 14:
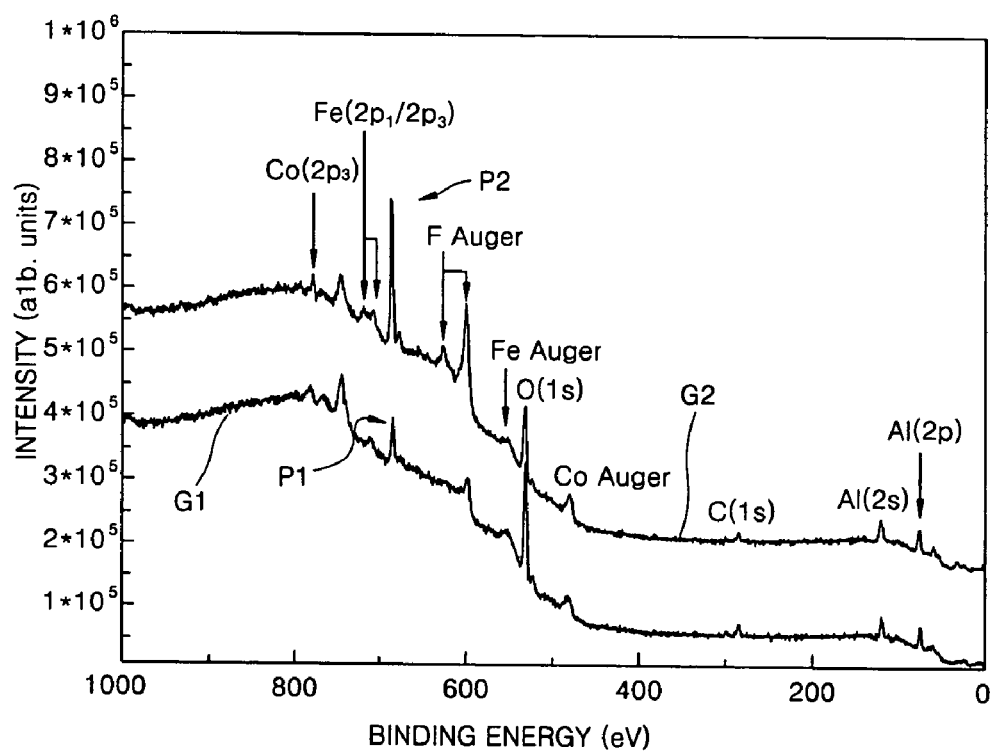
FIG. 14 is a graph showing x-ray spectra with respect to a conventional magnetic memory device and a magnetic memory device according to an embodiment of the present invention.

FIG. 14 is a graph showing X-ray spectra in an energy region of 0-1,000 eV of stacked layers used to form an MTJ cell of the first and second magnetic memory devices, before etching the stacked layers into the MTJ cell.

In FIG. 14, the first graph G1 represents a spectrum of the first magnetic memory device, and the second graph G2 represents a spectrum of the second magnetic memory device. The first peak P1 of the first graph G1 and the second peak P2 of the second graph G2 indicate strength of F 1$s$.

Comparing the first peak P1 of the first graph G1 to the second peak P2 of the second graph G2, it may be seen that the second peak P2 is much larger than the first peak P1. This means that the amount of fluorine contained in the tunneling film of the second magnetic memory device is greater than the amount of fluorine contained in the tunneling film of the first magnetic memory device. By comparing the peaks of the first and second graphs G1 and G2, it is observed that the magnitude of the first peak P1 of the first graph G1 is smaller than most other peaks. This means that the amount of fluorine contained in the tunneling film of the first magnetic memory device is almost negligible compared to the amount of fluorine contained in the tunneling film of the second magnetic memory device.

The first peak P1 of the first graph G1 is attributed to $CF_4$ stained on the surface of the tunneling film of the first magnetic memory device after a cleaning process. More specifically, after forming a tunneling film in a manufacturing process for forming a first magnetic memory device, a process for cleaning the tunneling film using $CF_4$ plasma is included. During this cleaning process, the $CF_4$ can be stained on the surface of the tunneling film, and generates the first peak P1. Therefore, the first peak P1 of the first graph G1 does not represent that fluorine is contained in the tunneling film of the first magnetic memory device.

Figure 15:
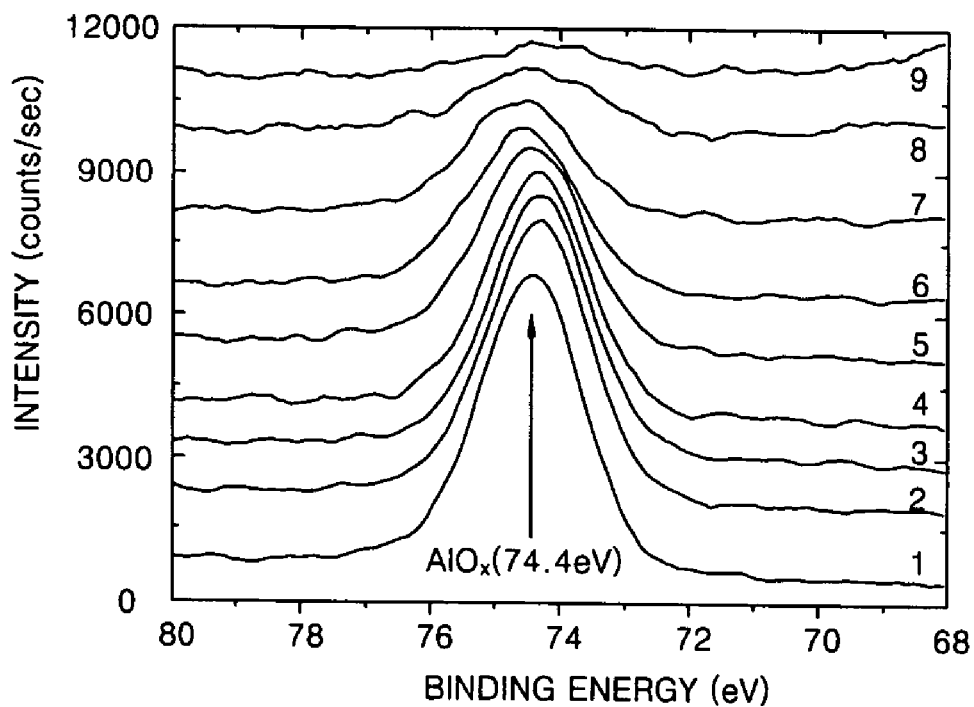
FIGS. 15 and 16 are graphs showing x-ray spectra with respect to an Al 2p core level of a conventional magnetic memory device and a magnetic memory device according to an embodiment of the present invention, respectively.
Figure 16:
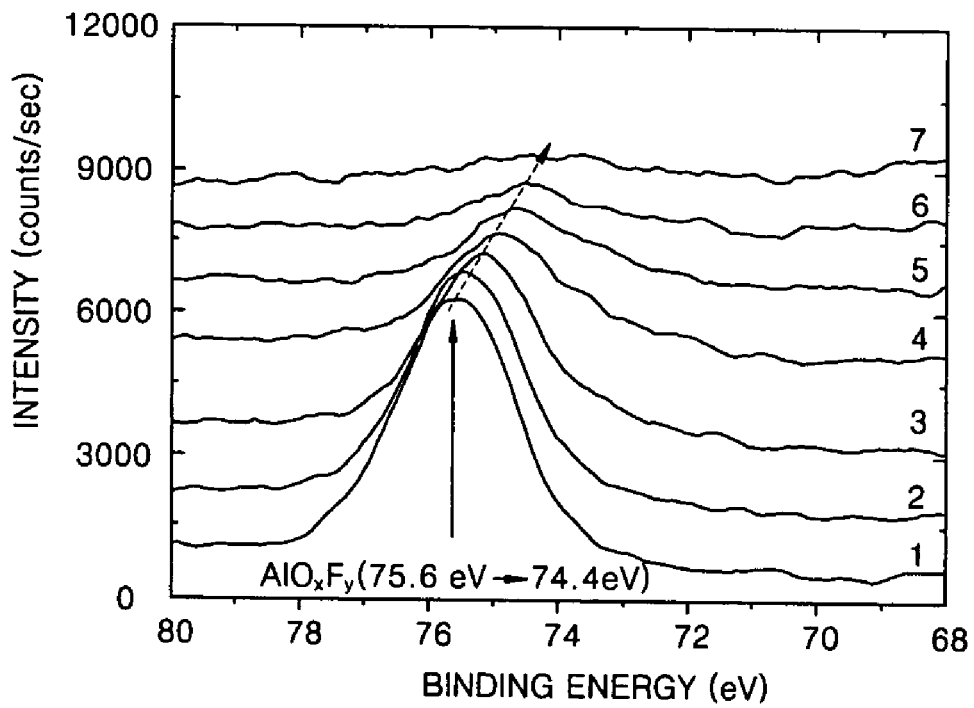

FIGS. 15 and 16 are graphs showing Al 2p core level spectra of the first and second magnetic memory devices, respectively. More specifically, the spectra shown in FIGS. 15 and 16 contain information about the existence of aluminum in the tunneling films of the first and second magnetic memory devices, respectively.

FIG. 15 shows spectra of the first magnetic memory device including a tunneling film formed by oxidizing for about eight minutes. FIG. 16 shows spectra of the second magnetic memory device including a tunneling film formed by oxy-fluoridating for fifteen minutes.

The spectra illustrated in FIGS. 15 and 16 are measured at different depths from a surface of each of the tunneling films of the first and second magnetic memory devices, respectively.

In FIGS. 15 and 16, reference numeral 1 represents a spectrum at a surface of the tunneling film of the first and second magnetic memory devices, and reference numeral 2 represents a spectrum slightly below the surface of the tunneling film of the first and second magnetic memory devices, respectively. As the reference numeral sequentially increases, a measuring depth in the tunneling film increases. Accordingly, as the reference numeral gets larger, a distance from the surface of the tunneling film increases, i.e., the measuring depth gets closer to the lower magnetic layer.

Referring to FIG. 15, the peak in the spectrum 1 measured on the surface of the tunneling film of the first magnetic memory device appears when a binding energy is 74.4 eV. This peak means that aluminium exists in the form of $AlO_x$ on the surface of the tunneling film of the first magnetic memory device. In spectrums 2 through 9 measured at increasing depths in the tunneling film of the first magnetic memory device, locations of peaks are the same as in spectrum 1 measured at the surface layer of the tunneling film. This result indicates that the entire tunneling film of the first magnetic memory device is formed of $AlO_x$.

Referring to FIG. 16, the peak in spectrum 1 measured on the surface of the tunneling film of the second magnetic memory device appears when a binding energy is 75.6 eV. This result indicates that aluminium in the surface layer of the tunneling film of the second magnetic memory device exists in the form of $AlO_xF_y$.

However, referring to spectrums 2 through 7 measured at increasing depths in the tunneling film of the second magnetic memory device in FIG. 16, the location of the peak shifts toward a binding energy of 74.4 eV as the depth increases. This result indicates that while aluminium at the surface of the tunneling film of the second magnetic memory device exists in the form of $AlO_xF_y$, below the surface, aluminum exists in the form of $AlO_x$.

Figure 17:
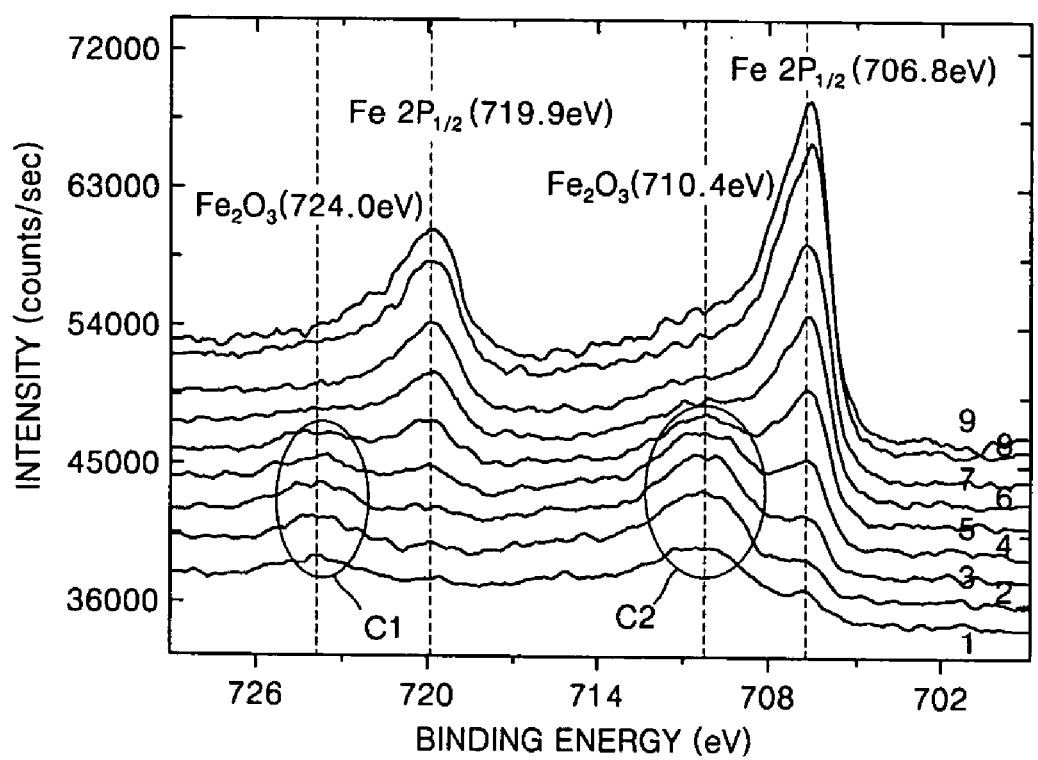
FIGS. 17 and 18 are graphs showing x-ray spectra with respect to an Fe 2p core level of a conventional magnetic memory device and a magnetic memory device according to an embodiment of the present invention, respectively.
Figure 18:
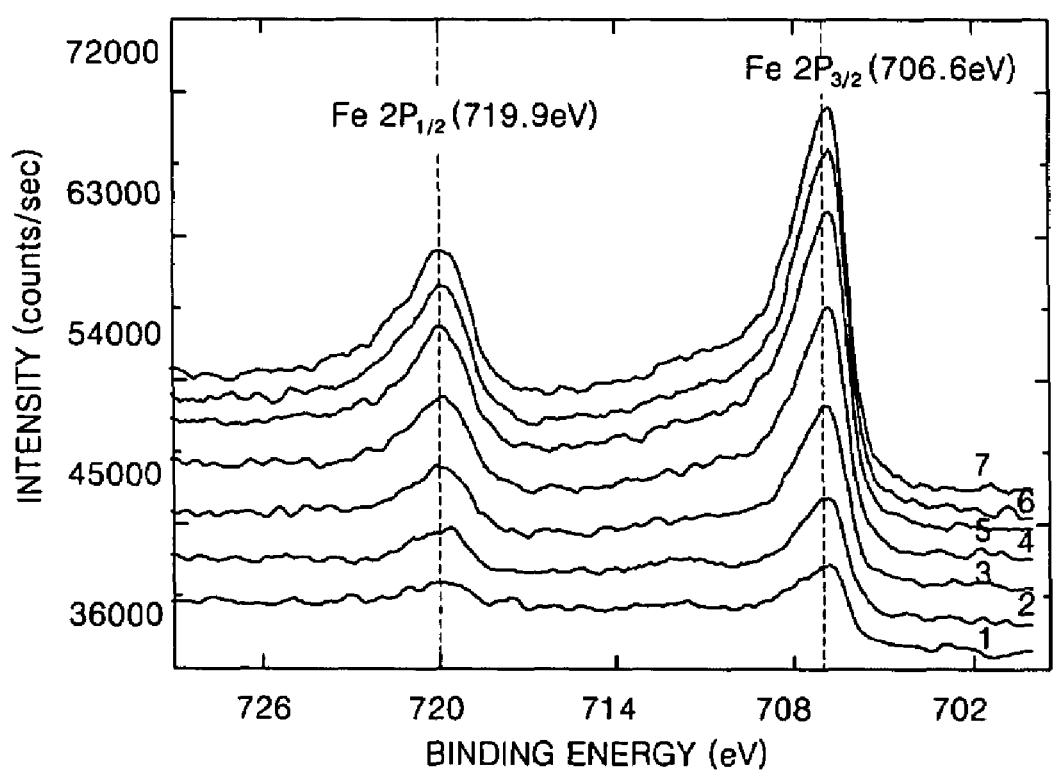

FIGS. 17 and 18 are graphs showing Fe 2p core level spectra of a tunneling film of the first and second magnetic memory devices, respectively. These graphs contain information about oxidation of the lower magnetic layer formed under the tunneling film during the oxidizing process in the course of forming the tunneling film of the first and second magnetic memory devices.

FIG. 17 shows spectra of the first magnetic memory device including a tunneling film formed by oxidizing for about eight minutes. FIG. 18 shows spectra of the second magnetic memory device including a tunneling film formed by oxy-fluoridating for about fifteen minutes.

Referring to FIG. 17, the first peak appears at a binding energy of 724.0 eV and the second peal appears at a binding energy of 710.4 eV. However, in FIG. 18, peaks do not appear at the same locations. The first and second peaks in FIG. 17 are attributed to the existence of iron oxide ($FeO_x$) or cobalt oxide ($CoO_x$).

By comparing FIGS. 17 and 18, in the case of the first magnetic memory device, the lower magnetic layer formed under the tunneling film was oxidized in the process of oxidizing the tunneling film. However, in the case of the second magnetic memory device, the lower magnetic layer formed under the tunneling film was not oxidized despite a longer oxy-fluoridating time than the first magnetic memory device.

As described above, according to an embodiment of the present invention, a tunneling film of a magnetic memory device may be formed to have a uniform thickness over an entire region, since the tunneling film is formed using an oxy-fluoridation process. Accordingly, a thickness deviation of the tunneling film in a cell and between cells can be minimized. Also, the low resistance of an MTJ cell can be maintained while maintaining high MR ratio, because the entire region of the tunneling film is evenly oxidized but the material film under the tunneling film is not oxidized during an oxy-fluoridation process. Further, an oxidizing process margin can be increased since the excellent characteristics of the tunneling film do not vary with the length of the oxy-fluoridation process.

Exemplary embodiments of the present invention have been disclosed herein and, although specific terms are employed, they are used and are to be interpreted in a generic and descriptive sense only and not for purpose of limitation. For example, one skilled in this art could apply the method of manufacturing a tunneling film according to the present invention to a memory device or to the manufacture of other semiconductor devices that require a film with similar characteristics as the tunneling film of the present invention. Accordingly, it will be understood by those of ordinary skill in the art that various changes in form and details may be made without departing from the spirit and scope of the present invention as set forth in the following claims.

What is claimed is:

1. A magnetic memory device, comprising:
    a switching device; and
    a magnetic tunneling junction (MTJ) cell connected to the switching device,
    the MTJ cell including:
        a lower electrode connected to the switching device; and
        a lower magnetic layer, a tunneling film containing fluorine, an upper magnetic layer, and a capping layer, sequentially stacked on the lower electrode,
    wherein the fluorine of the tunneling film is substantially uniformly distributed on a surface layer of the tunneling film.

2. The magnetic memory device as claimed in claim 1, wherein the lower magnetic layer comprises a buffer film, an anti-ferromagnetic (AF) film, and a synthetic anti-ferromagnetic (SAF) film, sequentially stacked.

3. The magnetic memory device as claimed in claim 1, wherein the tunneling film is an aluminium oxide film containing fluorine.

4. The magnetic memory device as claimed in claim 1, wherein the tunneling film is a metal oxide film containing fluorine.

5. A method of manufacturing a magnetic memory device including a switching device and a magnetic tunneling junction (MTJ) cell connected to the switching device, the method comprising:
    forming a lower electrode, which is connected to the switching device, on an interlayer insulating layer covering the switching device;
    forming a lower magnetic layer on the lower electrode;
    forming a metal film on the lower magnetic layer;
    performing a oxy-fluoridation process on the metal film, thereby forming a tunnelling film containing fluorine;
    forming an upper magnetic layer and a capping layer on the tunnelling film; and
    patterning the sequentially stacked layers on the lower electrode, wherein the fluorine of the tunnelling film is substantially uniformly distributed on a surface layer of the tunnelling film.

6. The method as claimed in claim 5, wherein forming the metal film comprises forming an aluminum film having a predetermined thickness.

7. The method as claimed in claim 5, wherein performing the oxy-fluoridation process on the metal film comprises:
    loading a resulting product on which the metal film is formed into a reaction chamber including an oxygen plasma generating means and a fluorine source supplying means; and
    supplying oxygen plasma and fluorine source onto the metal film.

8. The method as claimed in claim 7, wherein the fluorine source supplying means is a TEFLON® ring.

* * * * *